United States Patent
Jang et al.

(10) Patent No.: US 7,022,191 B2
(45) Date of Patent: Apr. 4, 2006

(54) METHOD OF CRYSTALLIZING AMORPHOUS SILICON LAYER AND CRYSTALLIZING APPARATUS THEREOF

(75) Inventors: Jin Jang, Seoul (KR); Soo-Young Yoon, Daejeon (KR); Jae-Young Oh, Jeju-shi (KR); Woo-Sung Shon, Seoul (KR); Seong-Jin Park, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/899,014

(22) Filed: Jul. 27, 2004

(65) Prior Publication Data
US 2004/0266189 A1 Dec. 30, 2004

Related U.S. Application Data

(63) Continuation of application No. 09/350,313, filed on Jul. 9, 1999, now Pat. No. 6,818,059.

(30) Foreign Application Priority Data

Jul. 10, 1998 (KR) ............................... 1998-22716
Oct. 21, 1998 (KR) ............................... 1998-44230

(51) Int. Cl.
*C30B 25/14* (2006.01)
(52) U.S. Cl. .................... 118/719; 118/715 R; 117/95; 117/96; 117/104; 117/200; 117/202

(58) Field of Classification Search ................ 117/104, 117/105, 95, 96, 200, 202; 118/715 R, 719
See application file for complete search history.

(56) References Cited

U.S. PATENT DOCUMENTS

| 5,585,291 A | * | 12/1996 | Ohtani et al. | ............... 438/486 |
| 5,851,860 A | * | 12/1998 | Makita et al. | ............... 438/166 |
| 5,923,962 A | * | 7/1999 | Ohtani et al. | ............... 438/150 |
| 6,309,951 B1 | * | 10/2001 | Jang et al. | ................... 438/486 |

* cited by examiner

*Primary Examiner*—Robert Kunemund
(74) *Attorney, Agent, or Firm*—McKenna Long & Aldridge LLP

(57) ABSTRACT

The present invention is related to a method of crystallizing an amorphous silicon layer and a crystallizing apparatus thereof which crystallize an amorphous silicon layer using plasma. The present invention includes the steps of depositing an inducing substance for silicon crystallization on an amorphous silicon layer by plasma exposure, and carrying out annealing on the amorphous silicon layer to the amorphous silicon layer. The present invention includes a chamber having an inner space, a substrate support in the chamber wherein the substrate support supports a substrate, a plasma generating means in the chamber wherein the plasma generating means produces plasma inside the chamber, and a heater at the substrate support wherein the heater supplies the substrate with heat.

8 Claims, 7 Drawing Sheets

METHOD OF CRYSTALLIZING AMORPHOUS SILICON LAYER AND CRYSTALLIZING APPARATUS THEREOF

This application is a continuation of prior application Ser. No. 09/350,313, filed Jul. 9, 1999 now U.S. Pat. No. 6,816,059.

This application claims the benefit of Korean Patent Application Nos. 98-27716 filed Jul. 10, 1998 and 98-44230 filed on Oct. 21, 1998, which is hereby incorporated by reference.

BACKGROUND OF THE INVENTION

1. Field of Invention

The present invention relates to a method of crystallizing an amorphous silicon layer and a crystallizing apparatus thereof in which the amorphous silicon layer is crystallized by using plasma.

2. Discussion of Related Art

In view of performance, low temperature polysilicon, of which product cost is low owing to its low formation temperature and which also provides wide image area, is as good as high temperature polysilicon. There are various methods for forming low temperature polysilicon, such as solid phase crystallization, laser crystallization and the like.

When providing low temperature crystallization under 400° C., which is disclosed in Hiroyaki Kuriyama, et al., *Jpn. J. Appl. Phys.*, 31, 4550 (1992), the laser crystallization fails to provide uniform crystallization and has difficulty in forming polysilicon on a substrate having a wide area due to an expensive apparatus and low productivity.

When polysilicon is formed by solid phase crystallization, uniform crystals are provided by using an inexpensive apparatus. However, the solid phase crystallization requires high temperature and long crystallization processing time. Such process is seldomly applied to forming polysilicon on a glass substrate and has low productivity.

A new method of crystallizing amorphous silicon at low temperature, known as metal-induced crystallization, is disclosed in M. S. Haque, et al., *J. Appl. Phys.*, 79, 7529 (1996). The metal-induced crystallization crystallizes amorphous silicon by contacting amorphous silicon with a specific kind of metal which induces crystallization of silicon and then by carrying out annealing, enabling lower crystallization temperature.

In Ni-induced crystallization, crystallization is accelerated by $NiSi_2$ which is the last phase of Ni silicide and works as a crystal nucleus, which is disclosed in C. Hayzelden, et al., *Appl. Phys. Lett.*, 60, 225 (1992). As a matter of fact, $NiSi_2$, which has a lattice constant of 5.406 Å similar to 5.430 Å of silicon, has the same structure as silicon. Thus, $NiSi_2$ works as a crystal nucleus of amorphous silicon, accelerating crystallization to the direction <111>, disclosed in Tanemasa Asano, et al., *Jpn. J. Appl. Phys.*, Vol. 36, pp. 1415–1419 (1997).

The metal-induced crystallization is affected by annealing time and temperature as well as quantity of metal. The crystallization time generally decreases as the quantity of metal increases.

Metal-induced crystallization has a crystallization temperature, but unfortunately requires a long thermal processing time of over 20 hours at 500° C. Therefore, this method still requires a high crystallization temperature as well as a long thermal process time.

As the quantity of metal increases, the metal-induced crystallization becomes more effective. However, intrinsic characteristics of a silicon layer are changed due to metal contamination in the crystallized silicon layer.

Generally, if the metal layer is formed on the amorphous silicon layer by using the sputtering method, it is difficult to reduce the amount of the metal material in the crystallized silicon layer. If the metal layer is formed on the amorphous silicon layer by using the coating method, it is possible to reduce the amount of the metal material applied to the crystallized silicon layer. However, the problem of the metal contamination could not be effectively solved.

Accordingly, when metal-induced crystallization is used, an improved method is required which reduces thermal treatment time, crystallization temperature, and metal contamination in a film.

SUMMARY OF THE INVENTION

Accordingly, the present invention is directed to a method of crystallizing an amorphous silicon layer and a crystallizing apparatus thereof that substantially obviate one or more of the problems due to limitations and disadvantages of the related art.

The object of the present invention is to provide a method of crystallizing an amorphous silicon layer and a crystallizing apparatus thereof which accelerate the crystallization of amorphous silicon by use of plasma while decreasing crystallization temperature.

Another object of the present invention is to provide a method of crystallizing an amorphous silicon layer and a crystallizing apparatus thereof which alleviate metal contamination in a crystallized silicon layer by controlling density and exposure time of plasma as well as forming metal-induced polysilicon on a glass substrate of a large area during a short period.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes the steps of depositing an inducing substance for silicon crystallization on an amorphous silicon layer by plasma exposure, and carrying out annealing on the amorphous silicon layer.

In another aspect, the present invention includes the steps of preparing a substrate on which an amorphous silicon layer is formed, depositing an inducing substance for silicon crystallization on the substrate by plasma exposure, and carrying out annealing on the substrate where the inducing substance is deposited.

In a further aspect, the present invention includes the steps of depositing an inducing substance for silicon crystallization on an amorphous silicon layer by plasma exposure as soon as annealing is carried out on the amorphous silicon layer.

In a further aspect, the present invention includes the steps of depositing an inducing substance for crystallization on an amorphous substance layer by plasma exposure, and carrying out annealing on the amorphous substance layer.

In a further aspect, the present invention includes the steps of depositing an inducing substance for crystallization on an amorphous substance layer by plasma exposure as soon as annealing is carried out on the amorphous substance layer.

In a further aspect, the present invention includes a chamber having inner space; a substrate support in the chamber, the substrate support supporting a substrate; a plasma generating means in the chamber, the plasma generating means producing plasma inside the chamber; and a heater at the substrate support, the heater supplying the substrate with heat.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF PREFERRED EMBODIMENTS

Reference will now be made in detail to the preferred embodiments of the present invention, examples of which are illustrated in the accompanying drawings.

A method of crystallizing an amorphous silicon layer according to the present invention is characterized by crystallizing amorphous silicon within a short period at low temperature without metal contamination by means of accelerating crystallization of the layer by using plasma.

An amorphous silicon layer experiences crystallization by forming a semiconductor layer of amorphous silicon on an insulated substrate, such as quartz, glass, oxide or the like, by exposing the semiconductor layer to plasma generated by RF power or DC power and by carrying out annealing with the presence of plasma, successively. Plasma induces silicon crystallization by having metal atoms inside a reaction chamber deposited on the amorphous silicon layer. In order to have specific metal deposited on the amorphous silicon layer as a plasma-exposed layer, plasma is generated from a metal bar or plate placed in the reaction chamber. In this case, noble metal or transition metal-forming silicide, such as Au, Ag, Al, Sb, In, Ni, Mo, Pd, Co, Ti, Cu, Fe, Cr or other materials known to one of ordinary skill in the art, is used as metal substance.

Figure 1:
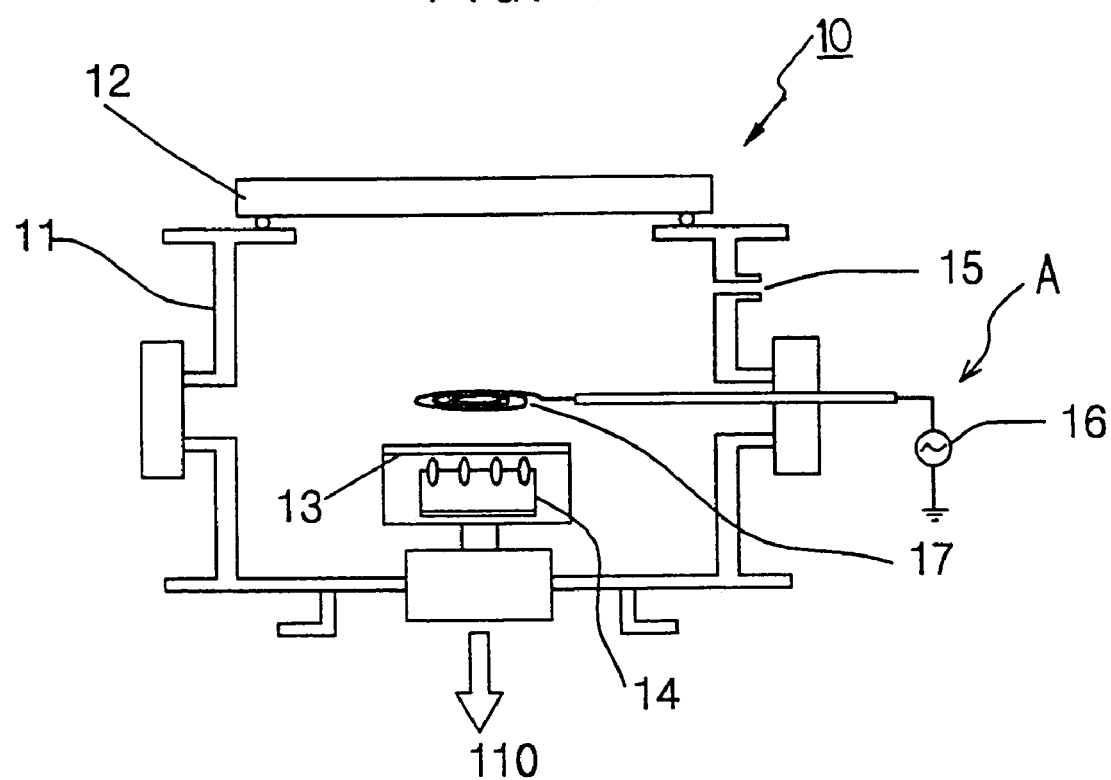
FIG. 1 shows a schematic drawing of an apparatus for crystallizing an amorphous silicon layer according to the present invention.

FIG. 1 shows a schematic drawing of a crystallization apparatus 10 for crystallizing an amorphous silicon layer according to the present invention. Referring to FIG. 1, in a reaction chamber 11, a substrate support 13 supports a substrate, which is exposed to plasma and on which metal atoms are deposited by a plasma generating device A. In this case, an amorphous silicon layer is formed on the substrate.

The plasma generating device A includes a metal bar 17 which becomes a metal source, working as a crystallization catalyst after being deposited on the amorphous silicon layer and being a path of supplying RF or DC power to generate plasma, and an RF/DC power supply 16 connected to the metal bar 17. The plasma generating device A may be substituted with other plasma inducing device known to one or ordinary skill in the art.

Placed in the reaction chamber 11 are a gas inlet 15 through which plasma source gases such as hydrogen, argon, nitrogen or helium, a heater 14 under the substrate support 13 for annealing the substrate, and an outlet 110 through which remaining gases or plasma inside the reaction chamber 11 are exhausted in vacuum. A quartz window 12 covers an upper part of the reaction chamber 11.

An operating procedure of the crystallization apparatus 10 in the above description will be explained in the following description. An amorphous silicon layer formed on a substrate is placed on the substrate support 13. Then, gas, such as nitrogen or helium, is injected into the reaction chamber 11 through the gas inlet 15. Then, plasma is generated inside the reaction chamber 11 by supplying the metal bar 17 with RF or DC power by the RF/DC power supply 16 of the plasma generating device A. Plasma collides with the metal bar 17 as soon as portions of metal atoms of the metal bar 17 are deposited on the amorphous silicon layer, thereby forming a plasma-exposed layer on the amorphous silicon layer. In this case, the amount of metal of the plasma-exposed layer is controlled by adjusting RF or DC power, time during which the amorphous silicon layer is exposed to plasma, or deposition pressure.

As mentioned in the above description, plasma is generated inside the reaction chamber 11 through the metal bar or plate 17 in order to have specific species of metal deposited on the amorphous silicon layer by plasma. In this case, noble metal or transition metal forming silicide, such as Au, Ag, Al, Sb, In, Ni, Mo, Pd, Co, Ti, Cu, Fe, Cr or the like, is used as the metal substance and the metal bar 17 may have various forms and shapes, such as a mesh and the like.

For silicon crystallization, crystallization is achieved by annealing which supplies the substrate with heat through the heater 14 under the substrate support 13.

Annealing may be carried out after the plasma-exposed layer has been formed or while plasma exposure is in progress. Namely, the amorphous silicon layer experiences crystallization by carrying out thermal treatment after exposure of the semiconductor layer of amorphous silicon to RF or DC plasma by using hydrogen, argon, nitrogen or helium gas, or by carrying out thermal treatment during exposure to RF or DC plasma.

After crystallization or formation of a plasma-exposed layer, the remaining gas or plasma inside the reaction chamber 11 is exhausted in a vacuum through the outlet 110. In this case, temperature of thermal treatment may range about 300° to 1000° C. It is important for the present invention to generate uniform plasma inside a vacuum reaction chamber 10 as well as maintain uniform temperature all over an amorphous silicon layer on a large scale.

Figure 2:
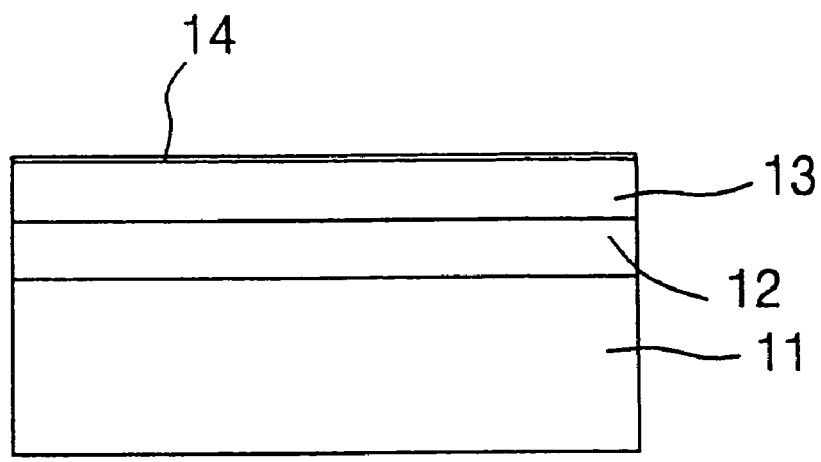
FIG. 2 shows a cross-sectional view of a substrate to crystallize an amorphous silicon layer according to a first embodiment of the present invention.
Figure 3:
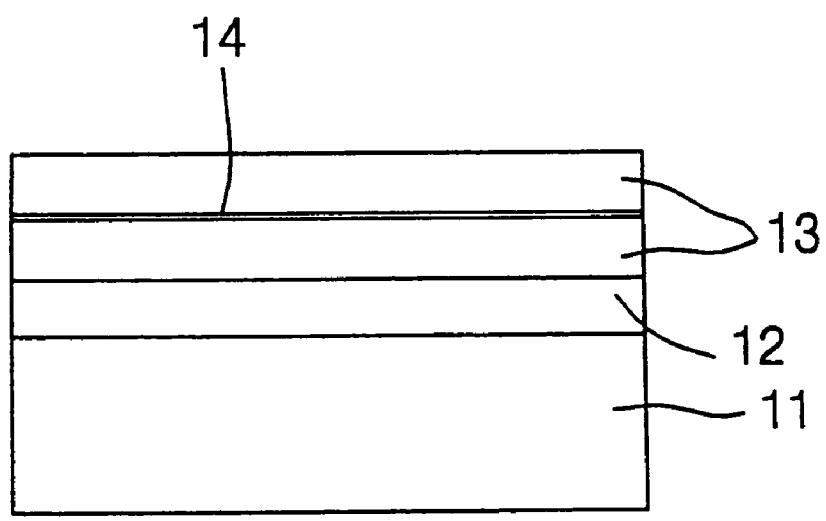
FIG. 3 shows a cross-sectional view of a substrate to crystallize an amorphous silicon layer according to a second embodiment of the present invention.
Figure 4:
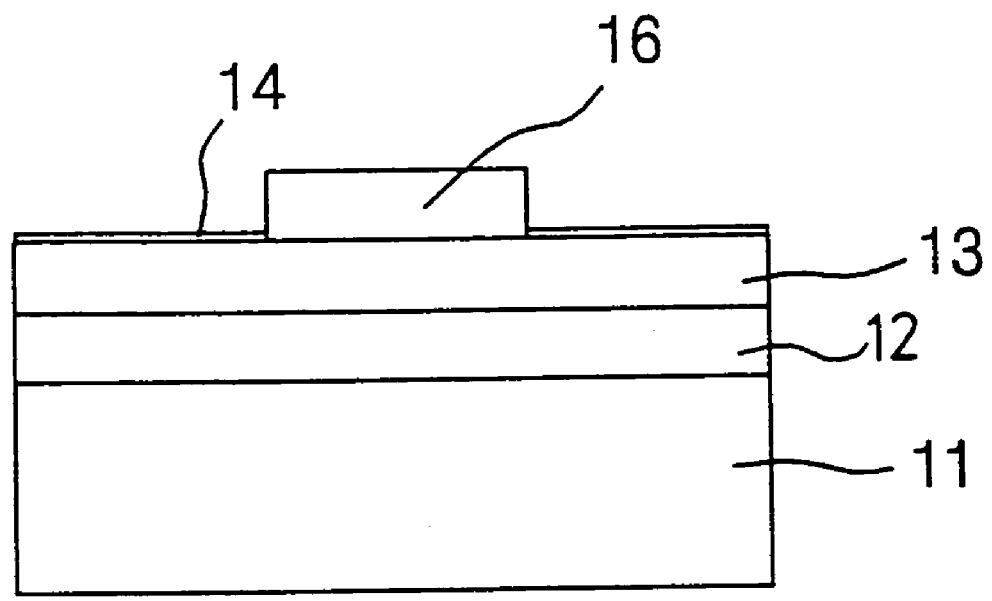
FIG. 4 shows a cross-sectional view of a substrate to crystallize an amorphous silicon layer according to a third embodiment of the present invention.

FIG. 2 shows a cross-sectional view of a substrate to crystallize an amorphous silicon layer according to a first embodiment of the present invention. FIG. 3 shows a cross-sectional view of a substrate to crystallize an amorphous silicon layer according to a second embodiment of the present invention. FIG. 4 shows a cross-sectional view of a substrate to crystallize an amorphous silicon layer according to a third embodiment of the present invention. The plasma-exposed layers in FIGS. 2–4 are formed by the crystallization apparatus 10 explained in the above-mentioned description.

Referring to FIG. 2, a buffer layer 12 is preferably formed on an insulated substrate 11. An amorphous silicon layer 13 is formed on the buffer layer 12. Then, a plasma-exposed layer 14 is formed by exposing the upper surface of the substrate to plasma.

Referring to FIG. 3, a buffer layer 12 is formed preferably on an insulated substrate 11. An amorphous silicon layer 13 is formed on the buffer layer 12. Then, a plasma-exposed layer 14 is formed on the amorphous silicon layer 13 by plasma exposure. Then, another amorphous silicon layer 13 is formed, successively.

Referring to FIG. 4, a buffer layer 12 is formed on an insulated substrate 11. An amorphous silicon layer 13 is formed on the buffer layer 12. An insulating layer 16 having a predetermined pattern is formed on the amorphous silicon layer 13. A plasma-exposed layer 14 is formed on the exposed amorphous silicon layer 13 by plasma exposure. In this case, the insulating layer 16 works as a mask for selectively exposing the amorphous silicon layer 13 to plasma.

In the above embodiments, the thickness of the plasma-exposed layers 14 is controlled by adjusting RF or DC power, time during which the amorphous silicon layer is exposed to plasma, or deposition pressure. As an alternative embodiment, the buffer layer 12 may be eliminated from the embodiments of FIGS. 2–4.

Figure 5:
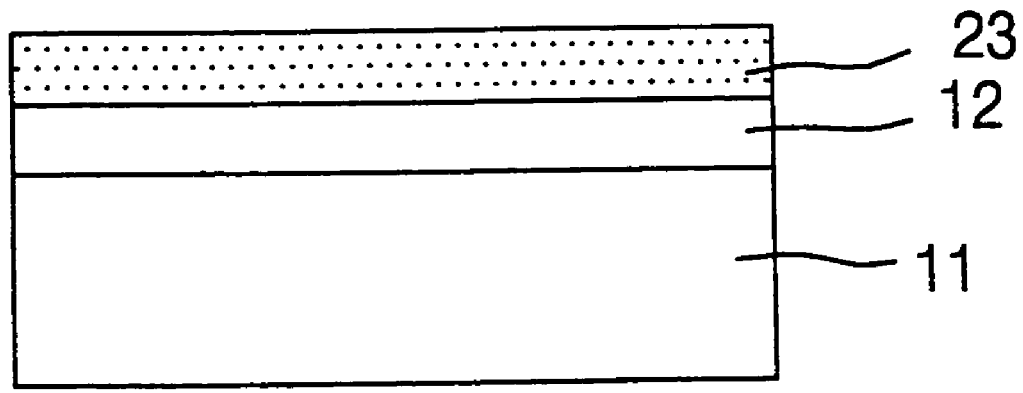
FIG. 5 shows a cross-sectional view of a substrate after crystallization of each amorphous silicon layer according to the first to third embodiments of the present invention.

FIG. 5 shows a cross-sectional view of a polysilicon layer and a glass substrate after crystallization of each amorphous silicon layer according to the first to third embodiments of the present invention. In FIG. 5, the cross-sectional view of the polysilicon layer without the electrodes 15 is shown. Referring to FIG. 5, the amorphous silicon layer 13, which was in contact with the plasma-exposed layer 14, is crystallized into a polysilicon layer 23. Thus, the polysilicon layer 23 is formed on the buffer layer 12 of the insulated substrate 11 according to each embodiment. In this case, plasma exposure may proceed during 0.1 to 1000 second(s) at about 0.5 mTorr to 100 Torr and plasma may be RF, DC or microwave plasma.

The embodiments of the present invention enable the control of the amount of metal substance to be deposited on the amorphous silicon layer 13, not by sputtering (which deposits a metal substance layer inducing silicon crystallization with bias voltage) but by plasma exposure, which deposits a metal substance without bias voltage, whereby it is easy to control the amount of metal substance to be deposited on the amorphous silicon layer 13. Forming a metal layer working as a catalyst for metal-induced crystallization by plasma exposure, the present invention reduces metal contamination of a crystallized silicon layer by avoiding the amorphous silicon layer from being contacted with massive metal, which is usually inevitable in the sputtering deposition.

Figure 6:
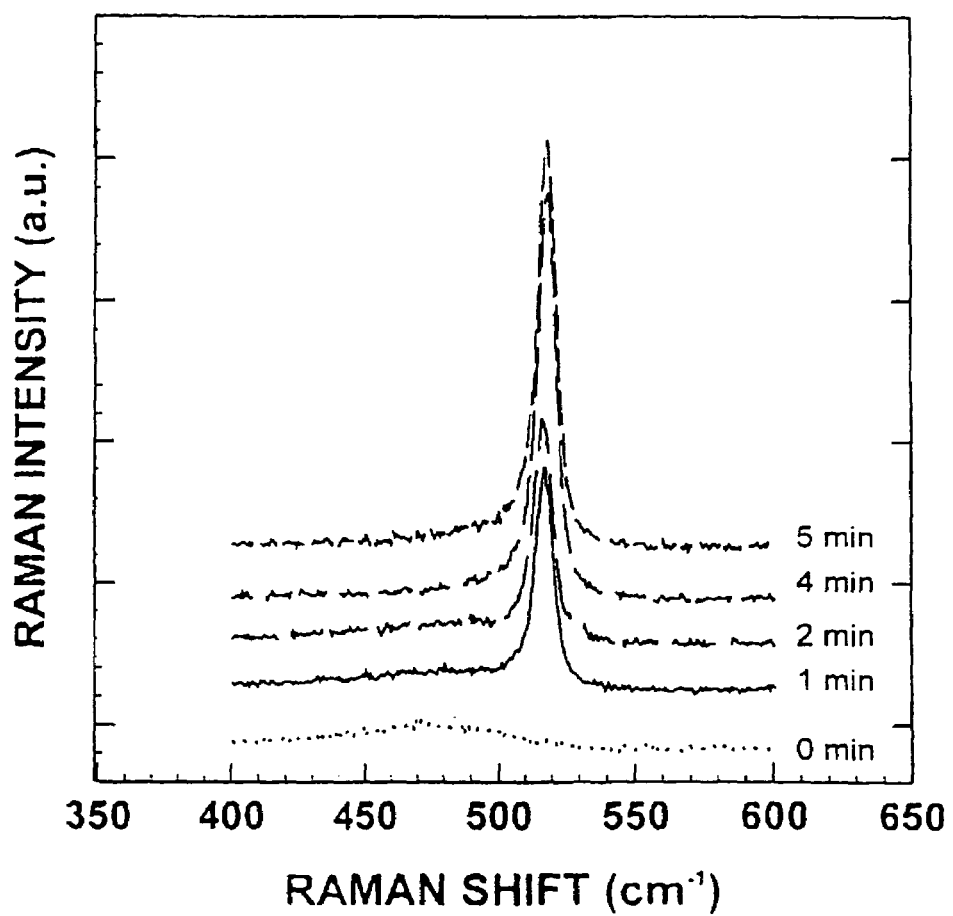
FIG. 6 shows Raman spectra of the silicon layers crystallized at about 500° C. according to the plasma exposure time.

FIG. 6 shows Raman spectrum of a silicon layer crystallized at about 500° C. during 30 minutes according to the time of being exposed to the plasma. RF plasma of 30 W, plasma deposition pressure of about 150 mTorr and excited nitrogen gas discharge used. In case of the silicon layer crystallized without being exposed by plasma, Raman peak is not shown. And, the strength of the Raman peak is in proportion to the time of being exposed by the plasma. A sharp Raman peak near 520/cm by transverse optical phonon mode indicates a crystalline body while a broad small Raman peak by micro-crystalline particles appears near 500/cm.

Figure 7:
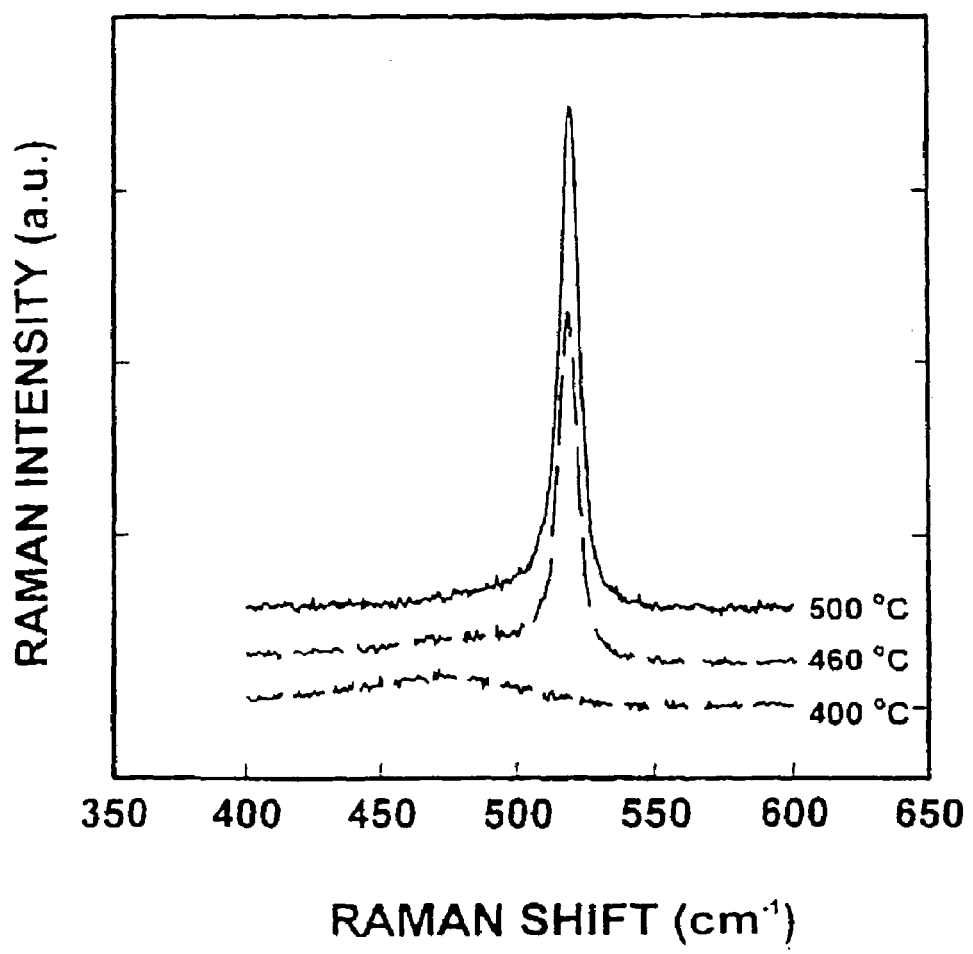
FIG. 7 shows Raman spectra of the silicon layers crystallized according to the annealing temperature.

FIG. 7 shows Raman spectra of the silicon layers crystallized according to the annealing temperature. Exposure time to plasma and annealing time are 10 minutes and 30 minutes, respectively. All the amorphous silicon layers are exposed to plasma at 100° C. to avoid heat conduction caused by plasma through the silicon layers. Then, without plasma, annealing is carried out. The amorphous silicon layer was fully crystallized at 500° C., but was not 460° C. for given annealing time of 30 minutes In case of the crystallized silicon layer at the temperature of more than 460° C., Raman peak due to crystallization is shown. However, in case of the crystallized silicon layer at the temperature of more than 400° C., Raman peak due to crystallization is not shown. And, the strength of the Raman peak is in proportion to the time of being exposed by the plasma. However, the characteristics of the Raman peak at the temperature of more than 460° C. is constant.

In both cases, a sharp Raman peak near 520/cm by transverse optical phonon mode indicates a crystalline body, while a small broad Raman peak by micro crystalline particles appears near 510/cm.

Figure 8:
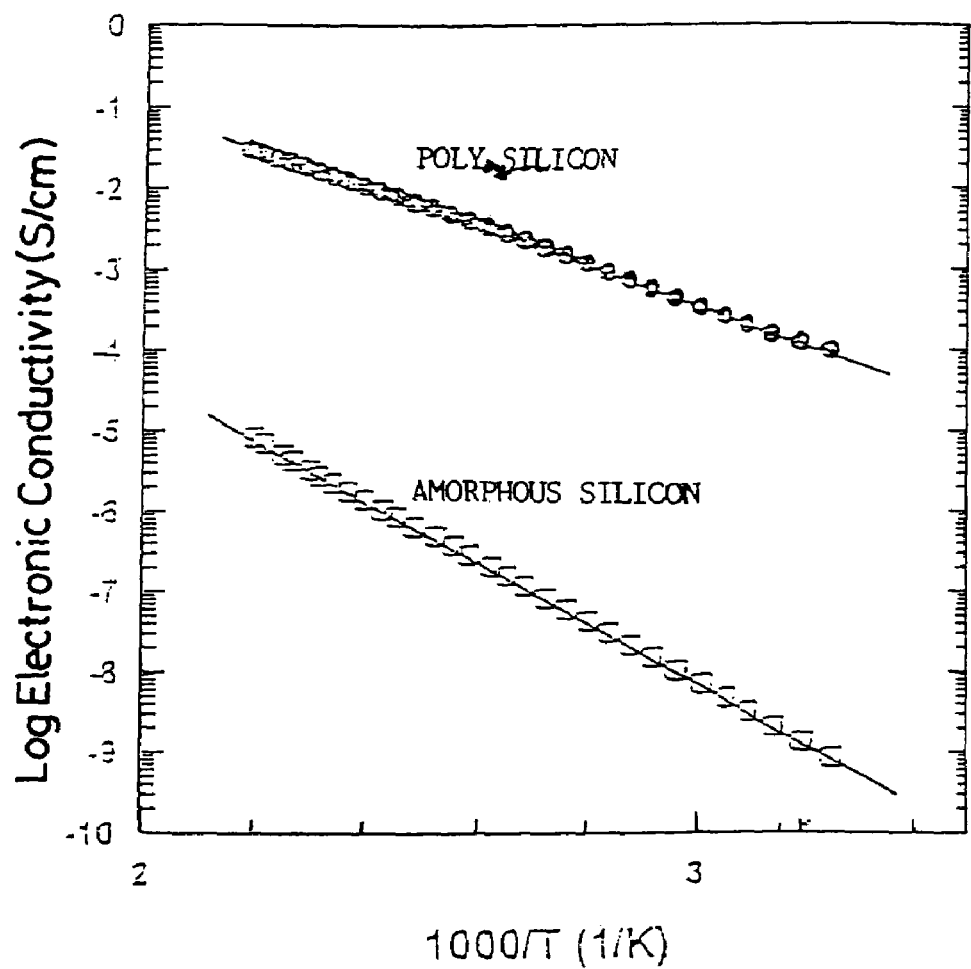
FIG. 8 shows electric conductivity of a silicon layer crystallized by the present invention and electric conductivity of a conventional amorphous silicon layer.

FIG. 8 shows electric conductivity of a silicon layer crystallized by the present invention and electric conductivity of a conventional amorphous silicon layer. Referring to FIG. 8, after plasma exposure of 5 minutes, crystallization is carried out for about 10 minutes at 500° C. Each electrical conductivity activation energy of the crystallized polysilicon layer and the amorphous silicon layer are 0.48 eV and 0.72 eV, respectively. There shows no hooping conductivity, but there are activated forms such as ELA (excimer laser annealing) poly-Si.

Figure 9:
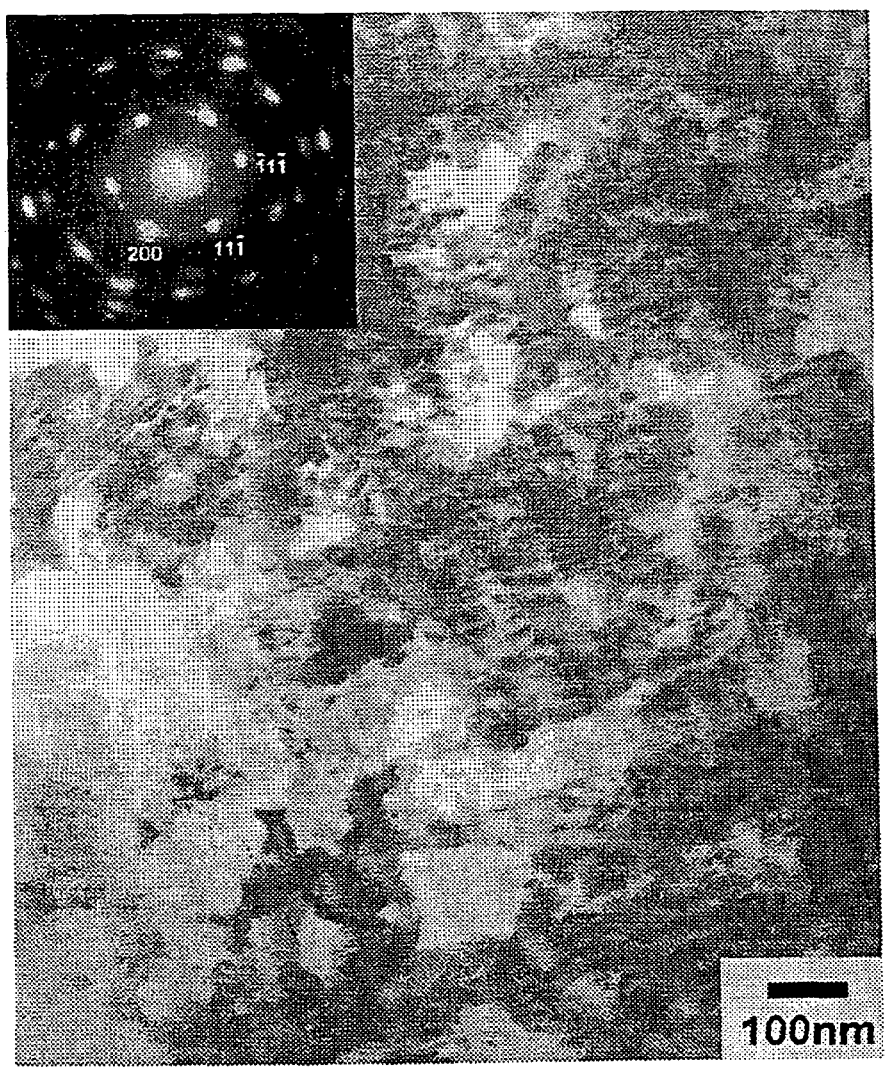
FIG. 9 shows a TEM photograph of a polysilicon layer crystallized at about 500° C. by the present invention.

FIG. 9 shows a TEM (transfer electron microscopy) light image and the diffraction pattern of a polysilicon layer crystallized by the embodiment of the present invention. There are many crystallites which have a stick shape and crystallization in the direction <111>. The stick-shaped crystallites have a width of about 1000 Å and a length of several μm. These crystallizations are shown in the crystallized silicon layer which is formed through crystallizing amorphous silicon comprising metal materials. Accordingly, the present invention teaches that the metal materials could be adsorbed in or on the silicon layer by use of plasma. There are no amorphous silicon in the crystallized silicon layer. And, the diffraction patterns are arranged in the direction <011>.

As a result of the present invention, wherein crystallization is carried out at about 300 to 1000° C., the whole layer is crystallized within a short period of less than 50 minutes under a thermal treatment. Metal contamination of the crystallized layer is substantially reduced by adjusting the amount of metal in the layer in accordance with plasma exposure time. Moreover, crystallization of amorphous silicon is achieved at about 460° C. Crystallization of the whole layer is completed within a short period such as 10 minutes, as well as metal contamination of the crystallized layer is greatly reduced by adjusting the amount of metal in the layer in accordance with plasma exposure time. It is possible to carry out successive deposition, crystallization and another deposition, provided that electrodes are placed in a plasma chemical vapor chamber and specific metal species separated from the electrodes are deposited by plasma. Therefore, interface characteristics are improved when semiconductor devices are fabricated.

The principle of the present invention is also applied to SRAM, solar cells and thin film transistors as drivers of a liquid crystal display.

It will be apparent to those skilled in the art that various modifications and variations can be made in a method of crystallizing an amorphous silicon layer and a crystallizing apparatus thereof of the present invention without departing from the spirit or scope of the invention. Thus, it is intended that the present invention covers the modifications and variations of this invention provided they come within the scope of the appended claims and equivalents.

What is claimed is:

1. A crystallizing apparatus, comprising:
   a chamber having inner space;
   a substrate support arranged in the chamber, the substrate support being used for supporting a substrate having an amorphous silicon layer formed thereon;
   a plasma generating device having a metal source connected to a power supply, the plasma generating device producing plasma inside the chamber by supplying the metal source with RF or DC power from the power supply to deposit a crystallization catalyst on an exposed surface of the amorphous silicon layer;
   a heater arranged at the substrate support, the heater supplying the substrate with heat for performing crystallization while the plasma generating device produces the plasma inside the chamber, wherein the performing crystallization is carried out for less than about 50 minutes.

2. The crystallizing apparatus according to claim 1, wherein the chamber has a gas inlet through which gas as a plasma source is provided to the chamber.

3. The crystallizing apparatus according to claim 1, wherein the chamber has an outlet for exhausting fluid.

4. The crystallizing apparatus according to claim 1, wherein the heat supplied by the heater is in a range from 300° C. to 1000° C.

5. A crystallizing apparatus, comprising:
   a chamber having inner space;
   a plasma generating device having a metal source connected to a power supply, the plasma generating device producing plasma inside the chamber by supplying the metal source with RF or DC power from the power supply to deposit a crystallization catalyst on an exposed surface of the amorphous silicon layer;
   a substrate support arranged in the chamber, the substrate support being used for supporting a substrate having an amorphous silicon layer formed thereon, the substrate being isolated from the power supply; and
   a heater arranged at the substrate support, the heater supplying the substrate with heat for performing crystallization while the plasma generating device produces plasma inside the chamber.

6. The crystallizing apparatus according to claim 5, wherein the metal source has a mesh shape.

7. The crystallizing apparatus according to claim 5, wherein the metal source includes one of Au, Ag, Al, Sb, In, Ni, Mo, Pd, Co, Ti, Cu, Fe and Cr.

8. The crystallizing apparatus according to claim 5, wherein the metal atom of the metal source forms a metal-silicide during the crystallization.

* * * * *